(12) United States Patent
Yang et al.

(10) Patent No.: US 7,850,449 B2
(45) Date of Patent: Dec. 14, 2010

(54) HEAT TREATMENT EQUIPMENT

(75) Inventors: Jae-Hyun Yang, Gyeonggi-do (KR);
Yo-Han Ahn, Gyeonggi-do (KR);
Kun-Hyung Lee, Gyeonggi-do (KR);
Gui-Young Cho, Gyeonggi-do (KR);
Hong-Hee Jeong, Gyeonggi-do (KR);
Mi-Ae Kim, Gyeonggi-do (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 778 days.

(21) Appl. No.: 11/775,640

(22) Filed: Jul. 10, 2007

(65) Prior Publication Data

US 2008/0011735 A1    Jan. 17, 2008

(30) Foreign Application Priority Data

Jul. 13, 2006   (KR) ...................... 10-2006-0065611

(51) Int. Cl.
*F27B 5/00*   (2006.01)
*F27B 5/10*   (2006.01)

(52) U.S. Cl. ........................ 432/251; 219/390; 118/733

(58) Field of Classification Search .................. 432/72, 432/152, 200, 205, 241, 247, 251; 219/390; 118/733
See application file for complete search history.

(56) References Cited

U.S. PATENT DOCUMENTS

| | | | | |
|---|---|---|---|---|
| 5,360,336 A | * | 11/1994 | Monoe | ......................... 432/5 |
| 5,458,685 A | * | 10/1995 | Hasebe et al. | ................ 118/724 |
| 5,578,132 A | * | 11/1996 | Yamaga et al. | ............... 118/724 |
| 5,813,851 A | * | 9/1998 | Nakao | ............................ 432/6 |
| 6,000,935 A | * | 12/1999 | Regimand et al. | ............. 432/72 |
| 6,159,298 A | | 12/2000 | Saito | |
| 7,044,731 B2 | * | 5/2006 | Saito | ........................... 432/72 |
| 2003/0221623 A1 | * | 12/2003 | Shima et al. | ................ 118/724 |

FOREIGN PATENT DOCUMENTS

| | | |
|---|---|---|
| JP | 2001-60555 | 3/2001 |
| JP | 2001-148379 | 5/2001 |
| JP | 2003-45867 | 2/2003 |
| JP | 2005-286051 | 10/2005 |
| KR | 10-2005-0036550 | 4/2005 |
| KR | 10-2006-0084554 | 7/2006 |

OTHER PUBLICATIONS

English language abstract of Japanese Publication No. 2001-148379.
English language abstract of Korean Publication No. 10-2005-0036550.
English language abstract of Japanese Publication No. 2005-286051.

* cited by examiner

*Primary Examiner*—Gregory A Wilson
(74) *Attorney, Agent, or Firm*—Volentine & Whitt, PLLC

(57) ABSTRACT

In an embodiment, heat treatment equipment comprises a process tube, an exhaust duct connected to the process tube, and, during operation, exhausting gases present within the process tube. The heat treatment equipment also comprises a hollow pressure control member interposed between the process tube and the exhaust duct, the pressure control member being operatively connected to the process tube and the exhaust duct respectively, and including one or a number of openings. Negative pressure is avoided in the process tube during heat treatment processes so that unwanted gas and impurities cannot enter the process tube from outside.

18 Claims, 5 Drawing Sheets

HEAT TREATMENT EQUIPMENT

CROSS-REFERENCE TO RELATED APPLICATION

This application claims priority from Korean Patent Application No. 2006-65611, filed Jul. 13, 2006, the disclosure of which is hereby incorporated herein by reference in its entirety as if set forth fully herein.

BACKGROUND

1. Technical Field

The present invention relates to equipment used in a semiconductor device fabrication process, and more particularly, to heat treatment equipment for processing a substrate such as a wafer through a heat treatment process.

2. Discussion of the Related Art

Technology for semiconductor products continues to rapidly develop. Parameters of these semiconductor products, such as a processing speed and an amount of data stored per volume, have improved with the technology.

Generally, semiconductor products are manufactured by the following processes: a wafer fabrication process of fabricating a wafer using pure silicon, a FAB process of fabricating semiconductor chips on the manufactured wafer, an EDS process of testing and repairing the fabricated semiconductor chips, and a packaging process of packaging the tested and repaired semiconductor chips.

Among the aforementioned processes, the FAB process may include a number of unit processes such as an oxidation process of forming a silicon oxide layer on a wafer, a photoresist coating process of coating the wafer with photoresist as a photosensitive agent, an exposure process of exposing the coated wafer to a light having a predetermined wavelength so that a certain pattern is transmitted on the coated photoresist, a photoresist bake process of baking the coated photoresist, a development process of developing the exposed pattern on the wafer, an etching process of etching a part or the whole of a thin film formed on the wafer, a deposition process of depositing a predetermined thin film on the wafer, an ion-implantation process of implanting impurities in a specific layer on the wafer, an anneal process of activating the impurities, and a diffusion process of diffusing the impurities in silicon.

The EDS process includes a number of unit processes such as a pre-laser process of generating data by testing semiconductor chips within the wafer and distinguishing good or bad semiconductor chips, a laser-repair process of repairing the semiconductor chips to be repaired based on the generated data by using a laser beam, a post-laser process of testing the repaired semiconductor chips in the wafer, a back grinding process of polishing the rear side of the wafer, a protection layer coating process of coating the semiconductor chips in the wafer with a protection layer such as a polyimide layer, and a protection layer bake process of baking the protection layer such as the coated polyimide layer.

Among the aforementioned unit processes, the oxidation process, the photoresist bake process, the deposition process, the anneal process, the diffusion process, and the protection layer bake process are performed by a heat treatment process. The heat treatment equipment to perform the heat treatment process falls into two categories; a single wafer type and a batch type.

The batch type generally includes horizontal and vertical furnace equipment. The vertical furnace equipment in the batch type is generally used because it has many merits such as high productivity and reliability.

Among the unit processes performed by the heat treatment process, the protection layer bake process is performed after pads formed in the semiconductor chips are bonded to lead frames. And this is done before the packaging process of enclosing the pads with epoxy molding compound.

The protection layer bake process is generally performed by loading a number of wafers a sealed tube, and heating the tube to about 250° C.~350° C. for about 2~3 hours. During the protection layer bake process, nitrogen ($N_2$) gas is continuously supplied into the tube as a process gas as a part of the ambient condition inside the tube.

Since various bad gases, including a silicon source out-gassing from the wafer, may be generated inside the tube during the protection layer bake process, the tube is typically connected to an exhaust duct positioned inside a clean room, so that the bad gases are continuously discharged to the outside.

However, in a conventional protection layer bake process, since the tube subjected to the bake process is directly connected to the exhaust duct, the gases present within the tube are rapidly discharged through the exhaust duct during the bake process. As a result, the pressure inside the tube is continuously maintained to be lower (hereinafter, referred to as "negative pressure") than the pressure inside the clean room in which the heat treatment equipment is positioned.

Consequently, since the pressure inside the tube is maintained at a negative pressure while the protection layer bake process is performed, an oxidant, such as $O_2$ or $H_2O$, present in the clean room flows into the tube due to the pressure difference between the clean room and the tube, even though the tube is sealed. As a result, the oxidant flowing into the inside of the tube interacts with the silicon source out-gassing from the wafers, causing an abnormal layer such as a silicon oxide layer ($SiO_2$) to grow on the pads formed in the semiconductor chips on the wafers. Consequently, the abnormal layer, such as the silicon oxide layer formed on the pads, acts as an element to deteriorate the wire bonding which connects the pads to the lead frames, and this may cause a malfunction or performance deterioration of packaged semiconductor products.

SUMMARY

Therefore, the present invention is directed to providing heat treatment equipment that prevents an abnormal layer from growing on pads formed in semiconductor chips on a wafer.

Another object of the present invention is to providing heat treatment equipment that prevents an oxidant existing inside a clean room from flowing into a process tube.

Exemplary embodiment provide heat treatment equipment comprising: a process tube; an exhaust duct connected to the process tube and exhausting gases present within the process tube; and a hollow pressure control member interposed between the process tube and the exhaust duct to be operatively connected to the process tube and the exhaust duct, and including one or more openings.

Preferably, the opening may include a check valve preventing a gas present within the pressure control member from discharging outside, through the opening.

Preferably, the process tube may include, at one side thereof, a gas exhaust hole through which gases present within the process tube are exhausted. In this case, the pressure control member may be installed in contact with the side of the process tube, to be operatively connected to the gas exhaust hole.

Preferably, the gas exhaust hole may be formed on the top side of the process tube. In this case, the pressure control member may be installed in contact with the top side of the process tube.

Preferably, the gas exhaust hole may be formed at one side of the process tube. In this case, the pressure control member may be installed in contact with the side of the process tube.

Preferably, the process tube may be operatively connected to the bottom of the pressure control member, and the exhaust duct may be operatively connected to the top of the pressure control member. In this case, the pressure control member may be formed in a cylinder shape, and the opening may be formed at a side of the pressure control member.

Preferably, the heat treatment equipment may further comprise a heater positioned outside the process tube and heating the process tube.

Other exemplary embodiments provide heat treatment equipment comprising: a process tube; an exhaust duct exhausting gases present within the process tube; a hollow pressure control member interposed between the process tube and the exhaust duct and including one or a number of openings; a first gas exhaust line connecting the process tube and the pressure control member to be operatively connected to each other; and a second gas exhaust line connecting the pressure control member and the exhaust duct to be operatively connected to each other.

Preferably, the opening may include a check valve preventing a gas present within the pressure control member from discharging outside through the opening.

Preferably, one end of the first gas exhaust line may be connected to the top side of the process tube, and the other end of the first gas exhaust line may be connected to the bottom side of the pressure control member.

Preferably, one end of the second gas exhaust line may be connected to the top side of the control pressure member, and the other end of the second gas exhaust line may be connected to the bottom side of the exhaust duct.

Preferably, the pressure control member may be formed in a cylinder shape. In this case, the opening may be formed at a side of the pressure control member.

Preferably, the heat treatment equipment may further comprise a heater positioned outside the process tube to heat the process tube.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. Like numbers refer to like elements throughout the specification.

Figure 1:
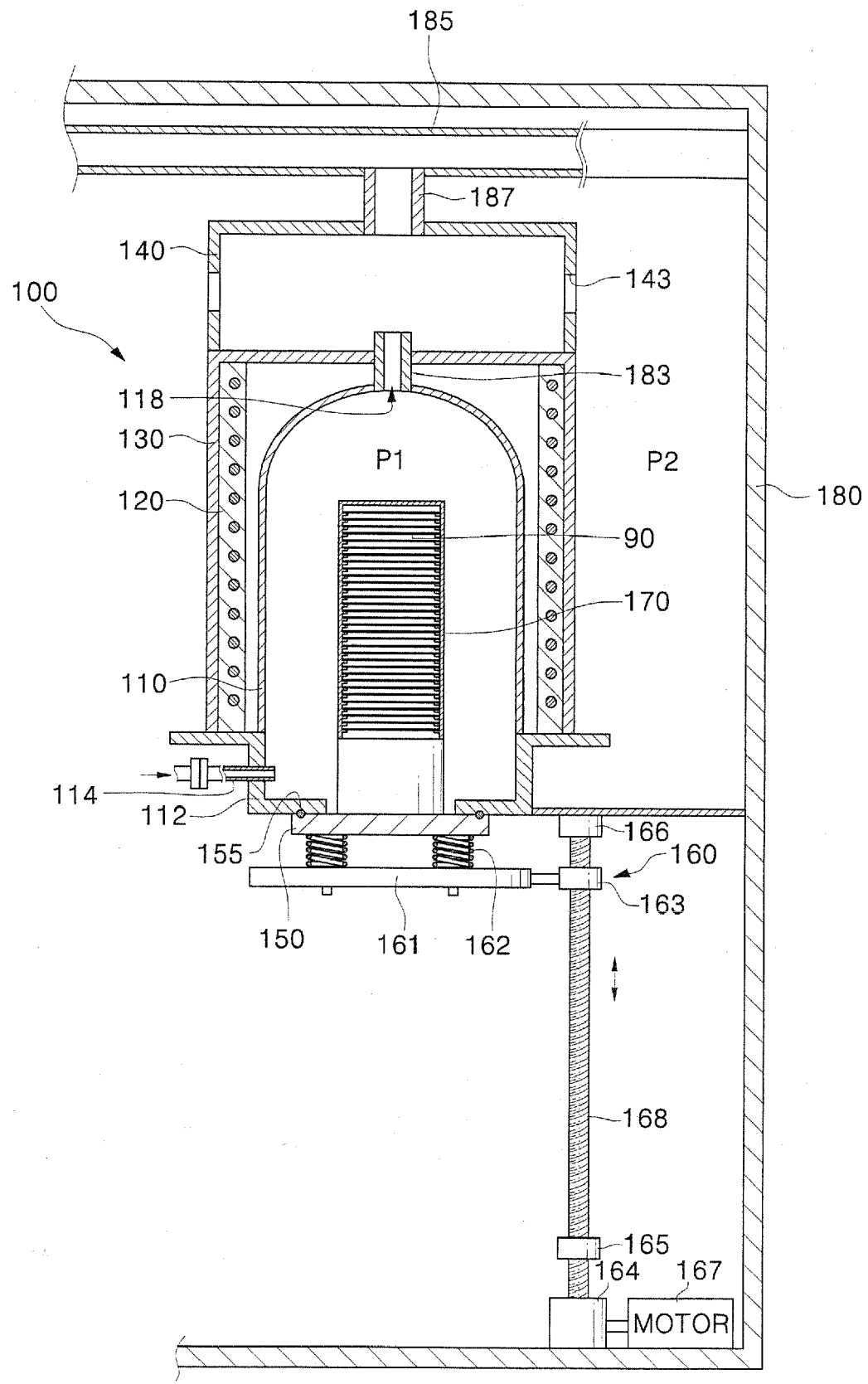
FIG. 1 is a cross-sectional view of heat treatment equipment in accordance with an embodiment.
Figure 2:
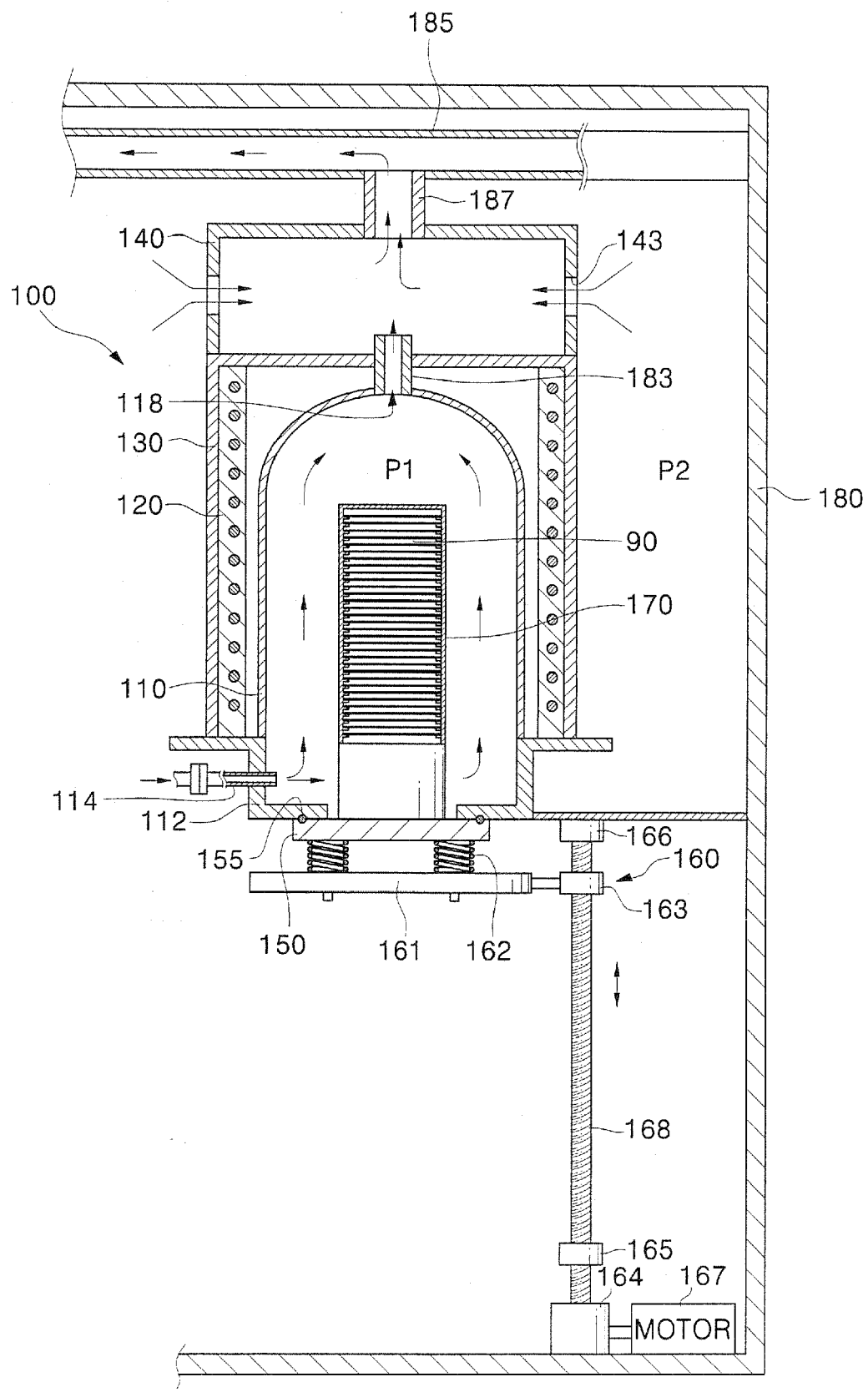
FIG. 2 is a cross-sectional view illustrating a flow path of gases, upon exhaust of the heat treatment equipment of FIG. 1.

FIG. 1 is a cross-sectional view of heat treatment equipment 100 in accordance with an embodiment of the present invention, and FIG. 2 is a cross-sectional view illustrating a flow path of gases during exhaust of the heat treatment equipment 100 of FIG. 1.

As illustrated in FIGS. 1 and 2, the heat treatment equipment 100, comprising vertical furnace equipment with a vertical-type process tube 110, is installed inside a clean room 180.

More specifically, the heat treatment equipment 100 comprises the process tube 110, a tube cap 150, a movement unit 160, a heater 120, an exhaust duct 185, a pressure control member 140, and a control unit (not shown). The process tube 110 provides a space for performing a heat treatment process on a wafer 90 and includes, at its one side, a wafer entrance/exit for wafers to enter and exit the process tube 110. The tube cap 150 seals the wafer entrance/exit of the process tube 110. The movement unit 160 moves the tube cap 150 during the process. The heater 120 heats the process tube 110. The exhaust duct 185 exhausts gases present within the process tube 110 to the outside. The pressure control member 140 is interposed between the process tube 110 and the exhaust duct 185 and maintains the pressure (P1) inside the process tube 110 to be higher than the pressure (P2) inside the clean room 180, which is the pressure outside the process tube 110. The control unit (not shown) generally controls the driving of the heat treatment equipment 100.

The process tube 110 may be formed in the shape of a hollow cylinder so that a number of wafers 90 can fit inside. The process tube 110 may be made of a quartz material that is suitable for the heat treatment process. In the embodiment, the wafer entrance/exit is positioned at a lower part of the process tube 110. The wafers 90 are sequentially loaded in a wafer boat 170 in a vertically arrangement. Then, the wafers 90 in the wafer boat 170 enter the process tube 110 through the wafer entrance/exit.

A gas exhaust hole 118 is formed on the top of the process tube 110. The gases present within the process tube 110 are exhausted through the gas exhaust hole 118. The gas exhaust hole 118 may be operatively connected to the pressure control member 140 through a first gas exhaust line 183 which is a separate line, or it may be directly connected to the pressure control member 140.

A flange 112 may be installed at the bottom of the process tube 110. The flange 112 is in contact with the process tube 110 to closely support the process tube 110. In this case, the wafer entrance/exit for entering or exiting the wafers 90 into or from the process tube 110 may be formed below the flange 112, and the wafer boat 170 is supplied into the process tube 110 through the wafer entrance/exit formed at the flange 112. A gas supply line 114 is installed at one side of the flange 112, to supply a predetermined ambient gas to the inside of the process tube 110 during the heat treatment process. The predetermined gas may be nitrogen (N₂) gas. The gas supply line 114 is installed at one side of the flange 112 in the present embodiment, but it may be directly installed at one side of the process tube 110 to supply the predetermined ambient gas to the inside of the process tube 110.

The tube cap 150 is moved by the movement unit 160 and selectively seals the wafer entrance/exit of the process tube 110. Here, the process tube 110 is sealed from the outside by the tube cap 150. A seal ring 155, such as an o-ring, may be placed on the tube cap 150 and be configured to come in contact with the process tube 110. In this case, the possibility of a leak between the process tube 110 and the tube cap 150 is minimized. When the flange 112 closely supporting the process tube 110 is installed at the bottom of the process tube 110, the tube cap 150 seals the wafer entrance/exit formed at the flange 112, thereby sealing the process tube 110.

The movement unit 160 moves the tube cap 150 to seal the process tube 110 during the heat treatment process. The movement unit 160 may be applied in various ways that are capable of moving the tube cap 150 a predetermined distance according to the control of the control unit. For example, a ball screw mode, cylinder mode, or linear motor mode may be applied as the movement unit 160.

As one example, the movement unit 160 comprises a cap base 161, a driving shaft 168, bearings 165 and 166, a base connector 163, a motor 167, and a power transmitter 164.

The cap base 161 supports the tube cap 150. The driving shaft 168 is vertically installed under the process tube 110 and includes a male screw on its outer surface. The bearings 165 and 166 are positioned at the upper and lower parts of the driving shaft 168, respectively, so that the driving shaft 168 rotates. The base connector 163 is installed about the driving shaft 168 so that the base connector 163 moves vertically according to the rotation direction of the driving shaft 168. One side of the base connector 163 is connected to the cap base 161.

The motor 167 rotates in two directions at a predetermined speed, so that the base connector 163 moves vertically. The power transmitter 164 transfers the rotation force of the motor 167 to the driving shaft 168, so that the driving shaft 168 rotates by the rotation of the motor 167.

When the tube cap 150 needs to be moved, the control unit sends a predetermined signal to the motor 167 for rotation. The driving shaft 168 then rotates at the predetermined speed by the power transferred from the power transmitter 164, and the base connector 163 is vertically moved at the predetermined distance by the rotation of the driving shaft 168. As a result, the cap base 161 is vertically moved at the predetermined distance by the movement of the base connector 163, and the tube cap 150 positioned above the cap base 161 is vertically moved at the predetermined distance by the vertical movement of the cap base 161. Consequently, the process tube 110 is opened or closed by the movement of the tube cap 150.

The movement unit 160 may further comprise an elastic member 162 to be installed between the tube cap 150 and the cap base 161. In this case, the holding force of the cap base 161 supporting the tube cap 150 is absorbed by the elastic member 162. When the tube cap 150 seals the process tube 110, the tube cap 150 gently comes into contact with the process tube 110 by the elastic force of the elastic member 162 and securely seals the process tube 110.

The heater 120 is positioned outside the process tube 110 and heats the process tube 110. The heater 120 is capable of heating the process tube 110 at different temperature according to each heat treatment process performed inside the process tube 110. For example, when the heat treatment process performed inside the process tube 110 is for the diffusion process, the heater 120 heats the process tube 110 to about 800° C.~1200° C. For another example, when the heat treatment process performed inside the process tube 110 is for the deposition process, the heater 120 heats the process tube 110 to about 500° C.~1000° C. For yet another example, when the process performed inside the process tube 110 is the protection layer bake process of baking the protection layer, such as a polyimide layer, coated on the semiconductor chips inside the wafers, the heater 120 heats the process tube 110 to about 250° C.~350° C.

The heater 120 may be applied in various modes which are capable of heating the process tube 110. For example, a coil heating mode, a lamp heating mode, or a peltier device may be applied as the heater 120. Preferably, the heater 120 may be the coil heat mode. Another process chamber 130 enclosing the heater 120 may be further installed outside the heater 120. In this case, since the heat of the heater 120 heating the process tube 110 does not flow out to the outside by the process chamber 130 enclosing the heater 120, the heating efficiency of the heater 120 is maximized.

In the embodiment, the exhaust duct 185 is installed above the process chamber 130 and is connected to the process tube 110 by the pressure control member 140. The gases present within the process chamber 130 are discharged outside through the pressure control member 140 and the exhaust duct 185. More specifically, one side of the exhaust duct 185 is connected to the pressure control member 140, and the other side of the exhaust duct 185 is connected to a gas pumping unit (not shown). The gases present within the process tube 110 are discharged outside through the pressure control member 140 and the exhaust duct 185 by the operation of the gas pumping unit. One side of the exhaust duct 185 may be directly connected to the pressure control member 140 or may be connected to the pressure control member 140 by a second gas exhaust line 187.

The pressure control member 140 maintains the pressure inside the process tube 110 to be higher than the pressure inside the clean room 180 where the heat treatment equipment 100 is installed, during the heat treatment process. The pressure control member 140 is interposed between the process tube 110 and the exhaust duct 185.

As an example, the bottom of the pressure control member 140 may be connected to the top of the process tube 110 by the first gas exhaust line 183 as described above, and the top of the pressure control member 140 may be connected to the bottom of the exhaust duct 185 by the second gas exhaust line 187 as described above. However, as another example, the bottom and top of the pressure control member 140 may be directly connected to the process tube 110 and the exhaust duct 185, respectively. In this case, preferably, the bottom of the pressure control member 140 may be installed to be operatively connected to the gas exhaust hole 118 through which the gases present within the process tube 110 are exhausted, as described above. The pressure control member 140 may be a hood directly connected to the process tube 110.

More specifically, the pressure control member 140 may be formed in the shape of a hollow cylinder. The first gas exhaust line 183 connected to the process tube 110 may be connected to the lower side of the cylinder-shaped pressure control member 140, and the second gas exhaust line 187 connected to the exhaust duct 185 may be connected to the upper side of the cylinder-shaped pressure control member 140.

One or more openings 143 being operatively connected to the clean room 180 are formed at the pressure control member 140. The gases present within the process tube 110 are exhausted using the exhaust duct 185 and the pressure control member 140 connected to the exhaust duct 185. Upon exhaust, the gases present outside the process tube 110, i.e., the gases present inside the clean room 180, may flow into the pressure control member 140 through the openings 143. That is, when the gases present within the process tube 110 are exhausted by the exhaust duct 185 and the pressure control member 140 connected to the exhaust duct 185, not only the gases present within the process tube 110 but also the gases present outside the process tube 110 flow into the pressure control member 140 and are discharged to the exhaust duct 185, through the openings 143 as a mixed gas. The openings 143 may be formed at a side of the pressure control member 140.

Figure 3:
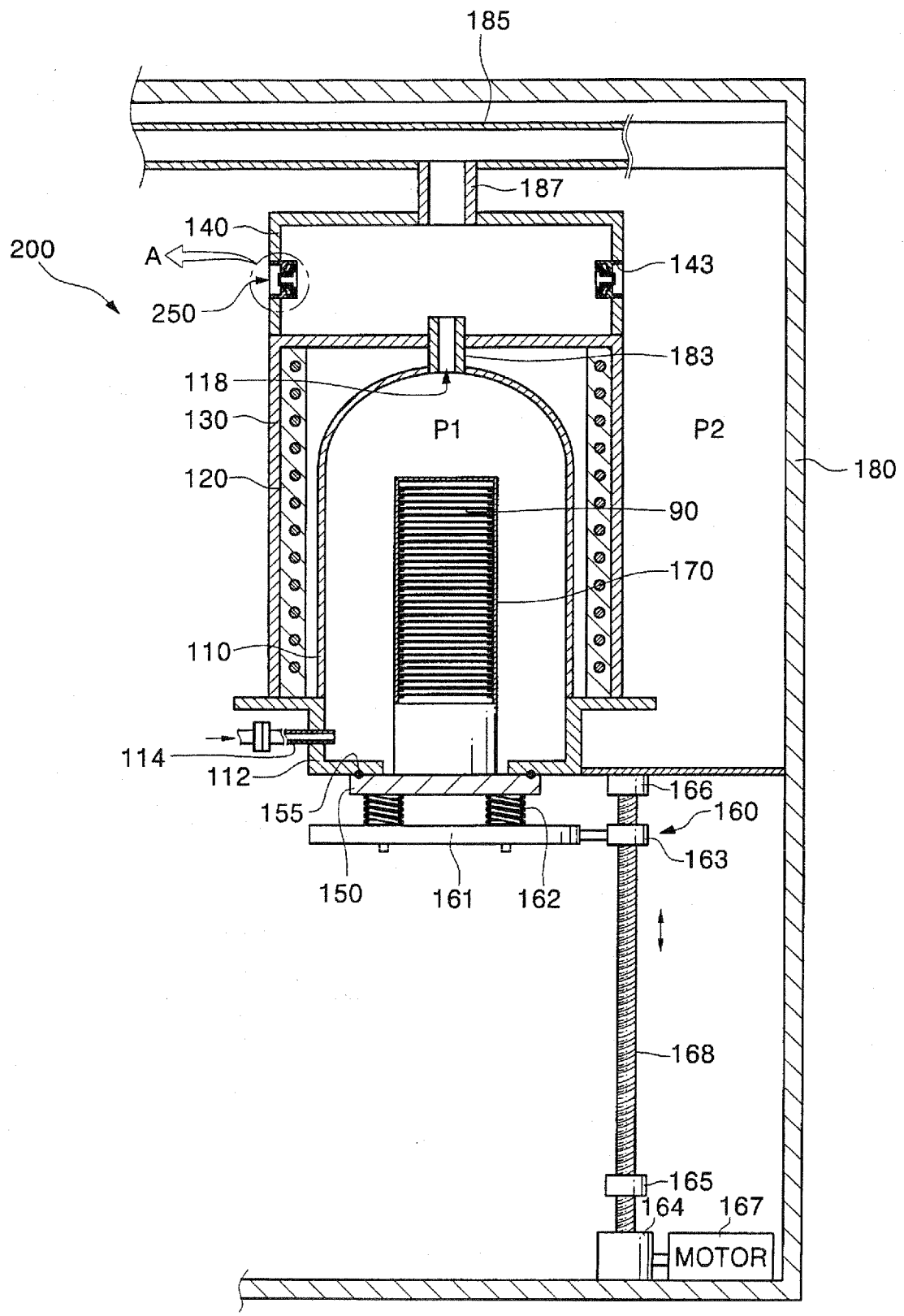
FIG. 3 is a cross-sectional view of heat treatment equipment in accordance with another embodiment.
Figure 4:
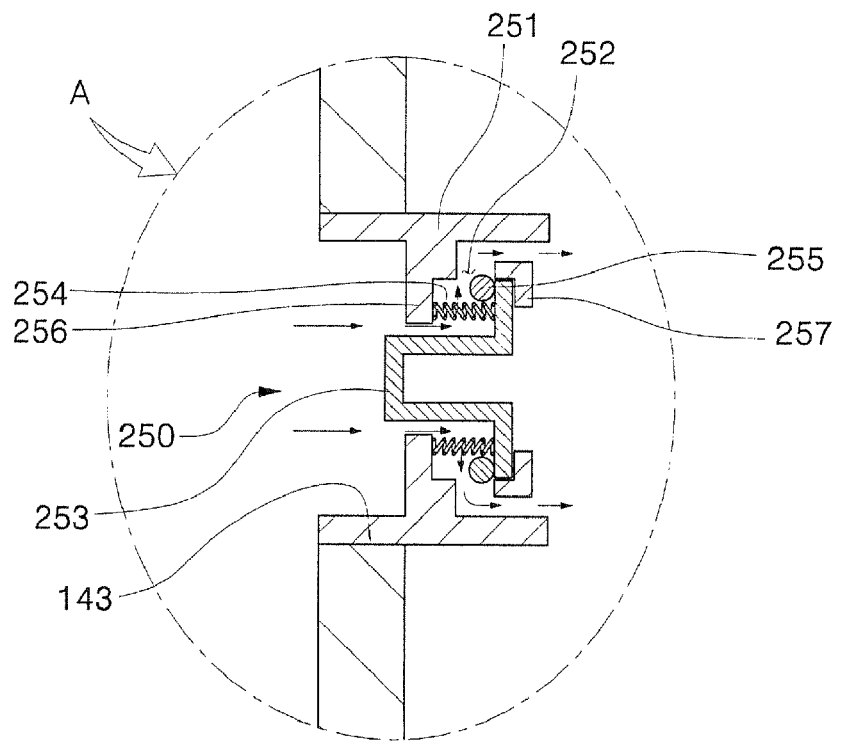
FIG. 4 is an enlarged cross-sectional view of the "A" portion of FIG. 3 showing a check valve in an open state.
Figure 5:
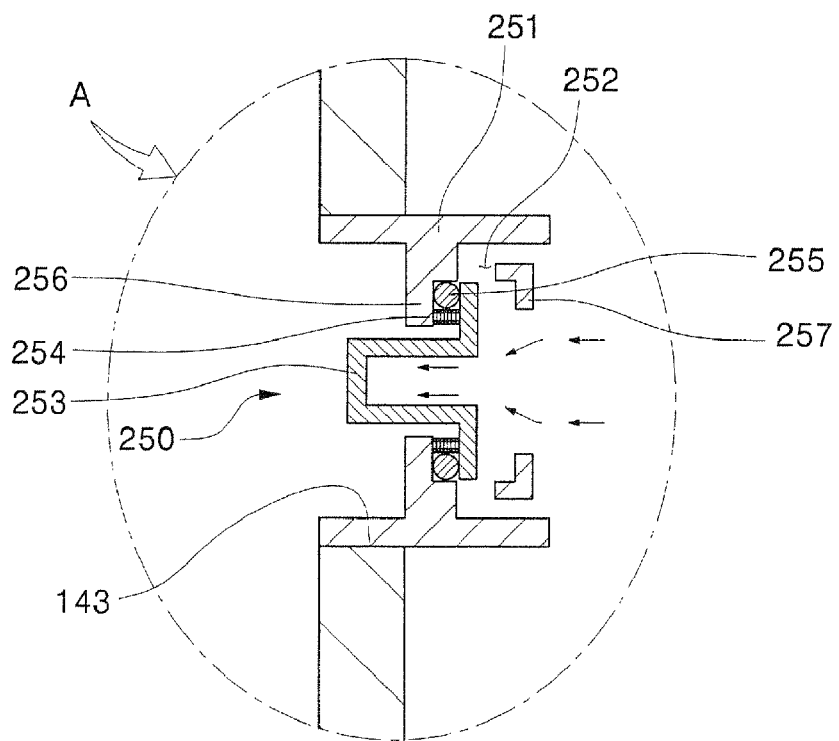
FIG. 5 is a cross-sectional view illustrating a check valve of FIG. 3 in a closed state.

The heat treatment equipment of the present invention may be realized in another embodiment illustrated in FIGS. 3 through 5.

FIG. 3 is a cross-sectional view of heat treatment equipment in accordance with another embodiment, FIG. 4 is an enlarged cross-sectional view of the "A" portion of FIG. 3, and FIG. 5 is a cross-sectional view illustrating a check valve 250 of FIG. 3 moved to a closed position.

As illustrated in FIGS. 3 through 5, heat treatment equipment 200 further comprises a check valve 250 in addition to the constituents of the heat treatment equipment 100 in accordance with the embodiment illustrated in FIGS. 1 and 2. The check valve 250 is installed in the opening 143 formed at the pressure control member 140, and prevents the gas present within the pressure control member 140 from being discharged to the clean room 180 through the opening 143. The check valve 250 may be a normally opened valve that is opened only when the gas present within the pressure control member 140 is smoothly exhausted through the exhaust duct 185 but is closed otherwise.

More specifically, the check valve 250 is installed at the opening 143 and comprises a valve housing 251, a movement member 253, and an elastic member 254. The valve housing 251 includes a gas flow path 252. The movement member 253 is installed inside the valve housing 251 and is reciprocally moved by a predetermined distance to open or close the gas flow path 252. The elastic member 254 is installed between the valve housing 251 and the movement 253 and allows the gas flow path 252 to be opened only when the gas present within the pressure control member 140 is smoothly exhausted.

The valve housing 251 may be formed in a tube shape. A pair of a first protrusion 256 and a second protrusion 257 may be formed inside the valve housing 251, spaced apart from each other at a predetermined interval, in a length direction of the valve housing 251. In this case, the gas flow path 252 may be formed between the first and second protrusions 256 and 257. Preferably, the first protrusion 256 may be formed inside the valve housing 251, at a position adjacent to the clean room 180, and the second protrusion 257 may be formed inside the valve housing 251, at a position adjacent to the inside of the pressure control member 140.

The movement member 253 may be formed between the first and second protrusions 256 and 257 in the valve housing 251. The movement member 253 opens or closes the gas flow path 252 formed between the first and second protrusions 256 and 257 while reciprocally moving between the first and second protrusions 256 and 257.

The elastic member 254 is positioned between the first protrusion 256 and the movement member 253 and pushes the movement member 253 toward the second protrusion 257, with a predetermined elastic force. Without an applied external force, the movement member 253 is pushed toward the second protrusion 257, as shown in FIG. 4, by the elastic force of the elastic member 254, and the gas flow path 252 is opened. As a result, the gas present outside the pressure control member 140 is able to flow into the pressure control member 140 through the gas flow path 252 of the check valve 250 positioned at the opening 143.

On the other hand, if the gas pumping unit to exhaust the gases present within the pressure control member 140 and the exhaust duct 185 is not working at full efficiency, the gas present within the pressure control member 140 and the exhaust duct 185 are not fully exhausted outside, and instead may flow backward into the pressure control member 140. In this case, an external force caused by the back flow of the gases acts on the movement member 253 as illustrated in FIG. 5. Then, the movement member 253 is pushed toward the first protrusion 256 by the external force, and the gas flow path 252 of the check valve 250 is closed. As a result, the gas present within the pressure control member 140 is not discharged outside through the opening 143, due to the operation of the check valve 250.

The check valve 250 may further comprise a seal ring 255 interposed between the first protrusion 256 and the movement member 253. In this case, the closing of the gas flow path 252 by the external force becomes more effective by the seal ring 255.

Figure 6:
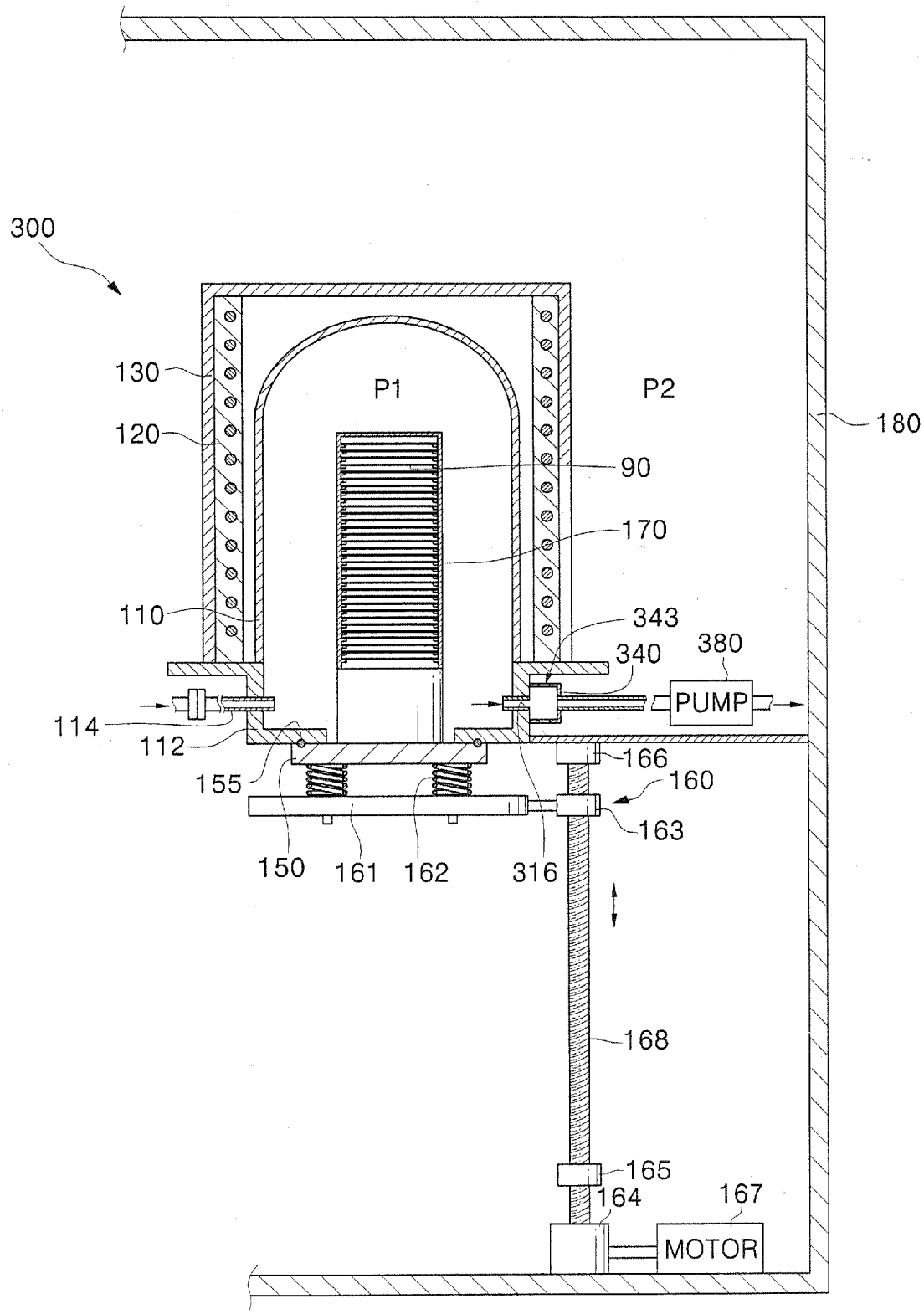
FIG. 6 is a cross-sectional view of heat treatment equipment in accordance with another embodiment of FIG. 1.

Another embodiment of heat treatment equipment is illustrated in the cross-sectional view of FIG. 6.

As illustrated in FIG. 6, heat treatment equipment 300 comprises a process tube 110, a gas supply line 114, a tube cap 150, a movement unit 160, a heater 120, a gas exhaust line 316, a pump 380, and a pressure control member 340. The process tube 110 provides a space for performing a heat treatment process on wafers 90 and includes, on its lower part, a wafer entrance/exit for supplying or exiting the wafers into or from the inside of the process tube 110. The gas supply line 114 supplies an ambient gas such as nitrogen ($N_2$) gas, in a certain amount, to the inside of the process tube 110, thereby forming the ambient condition inside the process tube 110. The tube cap 150 seals the wafer entrance/exit of the process tube 110. The movement unit 160 moves the tube cap 150 during the process. The heater 120 heats the process tube 110. The gas exhaust line 316 exhausts the gases present within the process tube 110 outside.

In this embodiment, the pump 380 is positioned on the gas exhaust line 316 and pumps the gases present within the process tube 110 to the outside. The pressure control member 340 is positioned on the gas exhaust line 316 and maintains the pressure inside the process tube 110 to be higher than the pressure inside the clean room 180, which is the pressure outside the process tube 110, during the process.

The gas exhaust line 316 may be formed at a side of the process tube 110. Then the gases present within the process tube 110 may be exhausted to the outside, through the gas exhaust line 316 positioned at the side of the process tube 110. The pressure control member 340 is positioned on the gas exhaust line 316 but may be positioned in contact with the side of the process tube 110.

More specifically, the pressure control member 340 is formed in a hollow cylinder shape, and one or more openings 343 being operatively connected to the clean room 180 are formed at a side of the pressure control member 340. When the gas present within the process tube 110 is exhausted by the gas exhaust line 316 and the pressure control member 340 connected to the gas exhaust line 316, not only the gas present within the process tube 110, which is supplied by the gas supply line 114, but also the gas present outside the process tube 110 flow into the pressure control member 340 and are discharged to the gas exhaust line 316 as a mixed gas, through the openings 343. As a result, since the amount of gas being discharged to the gas exhaust line 316 is the same as or less than the amount of gas being supplied to the inside of the process tube 110 by the gas supply line 114, the pressure inside the process tube 110 is maintained higher than the pressure inside the clean room 180, which is the pressure outside the process tube 110.

A method of performing a heat treatment process using the heat treatment equipment 100 and effects thereof will be described in detail with reference to the embodiments of FIGS. 1 and 2.

A user or a wafer transfer unit (not shown) first loads all wafers 90 in the wafer boat 170 positioned on the tube cap 150. The movement unit 160 then raises the tube cap 150, so that the wafer boat 170 moves into the process tube 110.

After the wafer boat 170 is moved into the process tube 110, the movement unit 160 again raises the tube cap 150 by a predetermined distance. This last motion helps to securely seal the tube cap 150 against the process tube 110.

After the tube cap 150 seals the process tube 110, the desired ambient condition for the heat treatment process is created inside the process tube 110. The heater 120 positioned outside the process tube 110 heats the process tube 110 to perform the heat treatment process. That is, a predetermined ambient gas, such as nitrogen ($N_2$) gas, may be continuously supplied through the gas supply line 114 connected to the process tube 110. The gas present within the process tube 110 may be continuously exhausted to the outside through the exhaust duct 185 connected to the gas exhaust hole 118 of the process tube 110, so that the predetermined ambient condition for the heat treatment process is formed inside the process tube 110.

During the heat treatment process, the gas exhaust hole 118 formed in the process tube 110 is not directly connected to the exhaust duct 185. Instead, the gas exhaust hole 118 is connected to the exhaust duct 185 through the hollow pressure control member 140 with one or more openings 143 formed at its side. Upon exhausting the gases, the pressure control member 140 and the openings 143 automatically control the pressure inside the process tube 110, so that the pressure (P1) inside the process tube 110 is maintained as a positive pressure higher than the pressure (P2) inside the clean room 180. Consequently, since the pressure (P1) inside the process tube 110 is maintained as the positive pressure, an oxidant, such as $O_2$ or $H_2O$ existing inside the clean room 180, cannot flow into the process tube 110 due to the pressure difference between the inside of the process tube 110 and the inside of the clean room 180. As a result, the embodiments of the present invention prevent all problems caused by an inflow of oxidants as are possible in the conventional art.

To the contrary, if the pressure control member 140 was not interposed between the exhaust duct 185 and the gas exhaust hole 118 of the process tube 110, as in conventional heat treatment equipment, but instead the exhaust duct 185 was directly connected to the gas exhaust hole 118 of the process tube 110, and when the amount of gas being discharged is greater than the amount of gas being supplied, the pressure (P1) inside the process tube 110 becomes lower than the pressure (P2) inside the clean room 180. This happens because, as mentioned above, the amount of the discharged gas is greater than the amount of the supplied gas. As a result, any oxidants existing outside the process tube 110 can flow into the process tube 110, thereby forming an abnormal layer on the wafers. This causes many problems such as wire bonding failure.

In the embodiments illustrated here, however, the hollow pressure control member 140 with one or more openings 143 formed at its side is interposed between the exhaust duct 185 and the gas exhaust hole 118 of the process tube 110. Thus, upon exhaust, if the amount of gas being discharged is greater than the amount of gas being supplied, no longer does the difference between the amount of the discharged gas and the amount of the supplied gas matter. Instead, the gas present within the clean room 180 automatically flows into the pressure control member 140 through the openings 143 and is then discharged to the outside through the exhaust duct 185. As a result, since the amount of the gas being exhausted through the exhaust duct 185 is the same as or less than the amount of the gas being supplied into the process tube 110, the pressure (P1) inside the process tube 110 is continuously maintained to be higher than the pressure (P2) inside the clean room 180, which is the pressure outside the process tube 110.

Thus, using the heat treatment equipment 100 in accordance with the embodiments presented here, since the pressure (P1) inside the process tube 110 is maintained as the positive pressure during the heat treatment process, any oxidants, such as $O_2$ or $H_2O$, existing inside the clean room 180 cannot flow into the process tube 110 due to the difference between the pressure (P1) inside the process tube 110 and the pressure (P2) inside the clean room 180.

As described above, in accordance with the embodiments of the heat treatment equipment presented here, the hollow-shaped pressure control member with one or more openings formed at its one side is interposed between the exhaust duct and the gas exhaust hole of the process tube. As a result, when gas is exhausted for the heat treatment process, if the amount of gas being discharged is greater than the amount of gas being supplied, this difference no longer matters because the gas present within the clean room can automatically flow into the pressure control member through the openings of the pressure control member, and is ultimately discharged to the outside through the exhaust duct. Consequently, since the amount of the gas discharged to the exhaust duct is the same as or less than the amount of the gas supplied to the inside of the process tube, the pressure inside the process tube is continuously maintained higher than the pressure inside the clean room, which is the pressure outside the process tube.

The present invention has been described in reference to the embodiments illustrated in the drawings. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. Heat treatment equipment comprising:
a process tube having an enclosed process space;
an exhaust duct connected to the process tube to exhaust gases present within the process tube; and
a hollow pressure control member interposed between the process tube and the exhaust duct, the pressure control member being operatively connected, via first openings, to the process tube and the exhaust duct respectively, and including one or more second openings to a part external to the process space,
wherein the process tube comprises a gas exhaust hole through which the gases present within the process tube are exhausted and the pressure control member is in physical contact with a side of the process tube so that the pressure control member is operatively connected to the gas exhaust hole.

2. The heat treatment equipment according to claim 1, wherein the one or more second openings comprise a check valve to prevent a gas present within the pressure control member from being discharged through the one or more second openings.

3. The heat treatment equipment according to claim 1, wherein the gas exhaust hole is formed in a top side of the process tube, and the pressure control member is in physical contact with the top side of the process tube.

4. The heat treatment equipment according to claim 1, wherein the gas exhaust hole is formed in a side of the process tube, and the pressure control member is in physical contact with the side of the process tube.

5. The heat treatment equipment according to claim 1, wherein the process tube is operatively connected to the bottom of the pressure control member, the exhaust duct is operatively connected to the top of the pressure control member, and the one or more second openings is formed at a side of the pressure control member.

6. The heat treatment equipment according to claim 5, wherein the pressure control member is the shape of a hollow cylinder.

7. The heat treatment equipment according to claim 1, further comprising a heater positioned outside the process tube to heat the process tube.

8. Heat treatment equipment comprising:
a process tube having an enclosed process space;
an exhaust duct for exhausting gases present in the process tube;
a hollow pressure control member interposed between the process tube and the exhaust duct and including one or more openings to a part external to the process space;
a first gas exhaust line enabling the process tube and the pressure control member to be operatively connected to each other via a first opening other than the one or more openings; and
a second gas exhaust line enabling the pressure control member and the exhaust duct to be operatively connected to each other via a second opening other than the one or more openings,
wherein the one or more openings comprise a check valve to prevent a gas present within the pressure control member from being discharged to outside through the opening.

9. The heat treatment equipment according to claim 8, wherein one end of the first gas exhaust line is connected to a top side of the process tube, and the other end of the first gas exhaust line is connected to a bottom side of the pressure control member.

10. The heat treatment equipment according to claim 9, wherein one end of the second gas exhaust line is connected to a top side of the pressure control member, and the other end of the second gas exhaust line is connected to a bottom side of the exhaust duct.

11. The heat treatment equipment according to claim 8, further comprising a heater outside the process tube to heat the process tube.

12. The heat treatment equipment according to claim 8, wherein the part external to the process space is a clean room.

13. Heat treatment equipment comprising:
a process tube having an enclosed process space;
an exhaust duct for exhausting gases present in the process tube;
a hollow pressure control member interposed between the process tube and the exhaust duct and including one or more openings to a part external to the process space;
a first gas exhaust line enabling the process tube and the pressure control member to be operatively connected to each other via a first opening other than the one or more openings; and
a second gas exhaust line enabling the pressure control member and the exhaust duct to be operatively connected to each other via a second opening other than the one or more openings,
wherein one end of the first gas exhaust line is connected to a top side of the process tube, and the other end of the first gas exhaust line is connected to a bottom side of the pressure control member,
wherein one end of the second gas exhaust line is connected to a top side of the pressure control member, and the other end of the second gas exhaust line is connected to a bottom side of the exhaust duct, and
wherein the pressure control member is cylindrical, and the one or more openings are formed on a side of the pressure control member.

14. Heat treatment equipment comprising:
a process tube having an enclosed process space;
an exhaust duct for exhausting gases present in the process tube;
a hollow pressure control member interposed between the process tube and the exhaust duct and including one or more openings to a part external to the process space;
a first gas exhaust line enabling the process tube and the pressure control member to be operatively connected to each other via a first opening other than the one or more openings;
a second gas exhaust line enabling the pressure control member and the exhaust duct to be operatively connected to each other via a second opening other than the one or more openings; and
a tube cap to hold objects to be heat treated and to seal the process tube, the tube cap operable to move to and from the process chamber.

15. A method of a heat treatment in a chamber, the method comprising:
providing a process gas at a first pressure in the chamber;
exhausting the gas into a pressure control chamber;
allowing an ambient gas external to the chamber, at a second pressure less than the first pressure, to enter the pressure control chamber;
forming a mixed gas that includes the process gas and the ambient gas; and
exhausting the mixed gas to outside the pressure control chamber.

16. The method of claim 15, further comprising:
placing semiconductor wafers to be heat treated onto a tube cap; and
raising the tube cap to load the wafers into the chamber until the tube cap contacts a bottom portion of the chamber so that the tube cap creates a gas-tight seal with the chamber.

17. The method of claim 15, further comprising controlling a flow of the ambient gas entering the pressure control chamber by using check valves.

18. The method of claim 15, the method further comprising:
supplying the ambient gas from a clean room, and
providing an entrance path of the ambient gas through openings formed within the pressure control chamber.

* * * * *